United States Patent
Ohta et al.

(10) Patent No.: US 6,499,125 B1
(45) Date of Patent: Dec. 24, 2002

(54) METHOD FOR INSERTING TEST CIRCUIT AND METHOD FOR CONVERTING TEST DATA

(75) Inventors: Mitsuyasu Ohta, Osaka (JP); Sadami Takeoka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/447,677

(22) Filed: Nov. 23, 1999

(30) Foreign Application Priority Data

Nov. 24, 1998 (JP) .......................... 10-332485

(51) Int. Cl.[7] .......................... G01R 31/28; G06F 17/50
(52) U.S. Cl. .......................... 714/734; 703/1
(58) Field of Search .............. 714/724, 725, 714/726, 727, 728, 729, 734, 738, 741, 30, 32, 33, 35; 703/1, 14, 15, 21, 23, 24, 25, 26

(56) References Cited

U.S. PATENT DOCUMENTS

| | | | |
|---|---|---|---|
| 5,748,642 A | * 5/1998 | Lesmeister | 702/119 |
| 6,018,814 A | * 1/2000 | Rockoff | 324/73.1 |
| 6,378,090 B1 | * 4/2002 | Bhattacharya | 712/38 |
| 6,381,717 B1 | * 4/2002 | Bhattacharya | 712/227 |

FOREIGN PATENT DOCUMENTS

| | | |
|---|---|---|
| JP | 061223669 A | 10/1986 |
| JP | 2-112777 | 4/1990 |
| JP | 03004186 | 1/1991 |
| JP | 5026975 | 2/1993 |
| JP | 5026980 | 2/1993 |
| JP | 10003488 | 1/1998 |

\* cited by examiner

*Primary Examiner*—Christine T. Tu
(74) *Attorney, Agent, or Firm*—McDermott, Will & Emery

(57) ABSTRACT

First, in the step of analyzing integrated circuit information, integrated circuit information is retrieved and the structure of the circuit is analyzed, thereby creating routing information for each functional block. Next, in the step of analyzing pin allocation information, pin allocation information, including input and output pin connection information for the functional block, is retrieved and the contents thereof are analyzed, thereby creating machine-readable pin combination information. The input pin connection information represents which input pin of the functional block should be connected to each external test data input pin. The output pin connection information represents which output pin of the functional block should be connected to each external test data output pin. Then, in the step of outputting testable integrated circuit information, information about a test data input or output circuit is added to the routing information, which has been analyzed in the step of analyzing integrated circuit information, based on the pin combination information, thereby outputting testable integrated circuit information.

14 Claims, 10 Drawing Sheets

METHOD FOR INSERTING TEST CIRCUIT AND METHOD FOR CONVERTING TEST DATA

BACKGROUND OF THE INVENTION

The present invention generally relates to a method for making a semiconductor integrated circuit easily testable. More particularly, the present invention relates to a method for inserting a test circuit into each of a plurality of functional blocks, of which a semiconductor integrated circuit will be made up and for which associated test data sets are prepared, so as to make the integrated circuit externally testable. The present invention also relates to a method for converting test data prepared for each single functional block into test data of the type making testable an integrated circuit to which a test circuit has been inserted.

In recent years, a multiplicity of functional blocks, each of which is pre-designed to execute its own intended function, are used as building blocks for a semiconductor integrated circuit to design the circuit more efficiently. Each of these functional blocks is sometimes provided with test data representing input and expected (output) values thereof to detect a fault through testing. Examples of the functional blocks include logic circuit blocks, memory circuit blocks and large-scale functional blocks such as IP (intellectual property), VC (virtual core) and core.

In testing a semiconductor integrated circuit consisting of these functional blocks using such test data, test circuits should be inserted into the integrated circuit to make each of these functional blocks externally testable. According to the conventional technique, however, descriptions of the routes associated with each of these functional blocks should be modified manually to insert the test circuit thereto.

Also, to make each functional block externally testable through the test circuit inserted, test data prepared for the functional block should be converted into test data applicable to testing the semiconductor integrated circuit. This test data conversion process is also performed manually according to the conventional technique.

However, as the size of a single functional block has been considerably increasing lately, the number of pins per logic block has also been rising by leaps and bounds to reach several hundreds, several thousands or more. Also, as the case may be, a single semiconductor integrated circuit is sometimes made up of a number of functional blocks as mentioned above. Accordingly, insertion of a test circuit involves the work of drawing up a netlist describing connection routes between the input and output pins of each functional block under test and associated external pins at gate level, for example. In addition, even if each functional block is provided with corresponding test data, that test data should be converted into test data adapted to test the semiconductor integrated circuit. As can be seen, if these processes of inserting the test circuit and converting the test data associated with each of these functional blocks are performed manually, then an enormous number of process steps have to be carried out. Thus, the designer is much more likely to commit numerous errors during such overly complicated manual operations.

SUMMARY OF THE INVENTION

A first object of the present invention is inserting test circuits non-manually to make a semiconductor integrated circuit made up of a plurality of functional blocks easily testable.

A second object of the present invention is converting test data prepared for each of the building functional blocks of a semiconductor integrated circuit into test data of the type making the functional blocks in the integrated circuit externally testable.

To achieve the first object, the present invention obtains pin combination information, representing to which input or output pin of a functional block each external pin should be connected, to update routing information contained in existent circuit information.

To achieve the second object, the present invention converts test data associated with each single functional block into test data of the type making the integrated circuit externally testable based on the pin combination information.

Specifically, a first exemplary inserting method according to the present invention is adapted to achieve the first object by inserting a test circuit into an integrated circuit, which is made up of a plurality of functional blocks interconnected, such that test data can be externally input to at least one of the functional blocks when the functional block is tested. The method includes the step of a) obtaining pin allocation information including input and output pin connection information for the at least one functional block under test. The input pin connection information represents which input pin of the functional block should be connected to each external test data input pin. The output pin connection information represents which output pin of the functional block should be connected to each external test data output pin. The method further includes the steps of: b) obtaining machine-readable pin combination information by analyzing the pin allocation information; and c) inserting a test data input circuit between the functional block under test and the external test data input pin or a test data output circuit between the functional block under test and the external test data output pin based on the pin combination information.

According to the first inserting method, pin allocation information, including input and output pin connection information, which represents which input or output pin of the functional block under test should be connected to each external test data input or output pin, is obtained manually or automatically. Then, the pin allocation information is analyzed to obtain machine-readable pin combination information. Thus, information about a testable integrated circuit, including the test circuit (i.e., the test data input or output circuit) applied to the functional block under test, can be obtained without actually designing the test circuit. That is to say, routing information for testing the functional block can be obtained without performing a great deal of modification work manually. As a result, the number of design process steps can be drastically cut down.

A second exemplary inserting method according to the present invention is adapted to achieve the first object by inserting a test circuit into an integrated circuit, which is made up of a plurality of functional blocks interconnected, such that test data can be externally input to at least one of the functional blocks when the functional block is tested. The method includes the step of a) preparing pin allocation information including input and output pin connection information for the at least one functional block under test. The input pin connection information represents which input pin of the functional block should be connected to each external test data input pin. The output pin connection information represents which output pin of the functional block should be connected to each external test data output pin. The method further includes the steps of: b) obtaining routing information by analyzing interconnection routes of the functional block based on information about the integrated circuit; c) obtaining machine-readable pin combination information by analyzing the pin allocation information; and d) inserting a test data input circuit and an input signal direction controller between the external test data input pin and the functional block under test based on the pin combination information. The test data input circuit is used for inputting test data through the external test data input pin to the input pin of the functional block under test in a test mode. The input signal direction controller is provided for enabling the external test data input pin, which functions as an output or bidirectional pin in a normal operation mode, to input the test data in the test mode. The method further includes the step of e) inserting a test data output circuit and an output signal direction controller between the functional block under test and the external test data output pin. The test data output circuit is used for outputting the test data to the external test data output pin through the output pin of the functional block under test in a test mode based on the pin combination information. The output signal direction controller is provided for enabling the external test data output pin, which functions as an input or bidirectional pin in a normal operation mode, to output the test data in the test mode. The method further includes the step of f) updating the routing information based on how the test data input or output circuit inserted is connected and outputting the updated routing information as testable integrated circuit information.

According to the second inserting method, only by defining (or describing) pin allocation information including input and output pin connection information, which represents which input or output pin of the functional block under test should be connected to each external test data input or output pin, the designer can obtain information about a testable integrated circuit, including the test circuit (i.e., the test data input or output circuit) applied to the functional block under test, without actually designing the test circuit. In addition, even if the external test data input pin functions as an output pin in the normal operation mode, the input pin can be used as a bidirectional pin by inserting the input signal direction controller thereto. Similarly, even if the external test data output pin functions as an input pin in the normal operation mode, the output pin can also be used as a bidirectional pin by inserting the output signal direction controller thereto. Thus, the inventive method is easily adaptable to an automated design process.

In one embodiment of the present invention, the step a) preferably includes obtaining partitioning information for classifying the input or output pin connection information into a plurality of groups. The step d) preferably includes inserting the test data input circuit into each said group based on the partitioning information. And the step e) preferably includes inserting the test data output circuit into each said group based on the partitioning information. In such an embodiment, the test circuit itself can be laid out for each of the groups partitioned, thus improving the efficiency of a layout design process.

In another embodiment, the step a) preferably includes obtaining signal shaping buffer information indicating whether or not a signal shaping buffer should be added to the test data input or output circuit to shape a waveform of a signal that has been rounded during the propagation thereof. The step d) preferably includes inserting the signal shaping buffer into the test data input circuit based on the signal shaping buffer information. And the step e) preferably includes inserting the signal shaping buffer into the test data output circuit based on the signal shaping buffer information. In such an embodiment, a signal shaping buffer can be incorporated if necessary before a layout is defined, thus improving the efficiency of a layout design process.

In still another embodiment, the second method may further includes, between the steps c) and d) and between the steps d) and e), the steps of: estimating, based on the pin allocation information, how long a wire length of the test data input or output circuit inserted will be after the circuit has been laid out; deciding whether or not a signal shaping buffer should be added to the test data input or output circuit to shape a waveform of a signal that has been rounded during the propagation thereof; and adding a result of the decision as signal shaping buffer information to the pin combination information. The step d) preferably includes inserting the signal shaping buffer into the test data input circuit based on the signal shaping buffer information. And the step e) preferably includes inserting the signal shaping buffer into the test data output circuit based on the signal shaping buffer information. In such an embodiment, a signal shaping buffer can be incorporated if necessary before a layout is defined, thus improving the efficiency of a layout design process.

In still another embodiment, the step a) preferably includes obtaining timing adjusting flip-flop information indicating whether or not a timing adjusting flip-flop should be added to the test data input or output circuit to prevent the integrated circuit from operating erroneously due to a considerable signal delay defined with respect to a clock period thereof. The step d) preferably includes inserting the timing adjusting flip-flop into the test data input circuit based on the timing adjusting flip-flop information. And the step e) preferably includes inserting the timing adjusting flip-flop into the test data output circuit based on the timing adjusting flip-flop information. In such an embodiment, a timing adjusting flip-flop can be incorporated if necessary before a layout is defined, thus improving the efficiency of a layout design process.

In still another embodiment, the second method may further include, between the steps c) and d) and between the steps d) and e), the steps of: estimating, based on the pin allocation information, how long a signal delay of the integrated circuit will be with respect to the clock period thereof after the integrated circuit has been laid out; deciding whether or not a timing adjusting flip-flop should be added to the test data input or output circuit to prevent the integrated circuit from operating erroneously due to the signal delay; and adding a result of the decision as timing adjusting flip-flop information to the pin combination information. The step d) preferably includes inserting the timing adjusting flip-flop into the test data input circuit based on the timing adjusting flip-flop information. And the step e) preferably includes inserting the timing adjusting flip-flop into the test data output circuit based on the timing adjusting flip-flop information. In such an embodiment, a timing adjusting flip-flop can be incorporated if necessary before a layout is defined, thus improving the efficiency of a layout design process.

A third exemplary inserting method according to the present invention is adapted to insert a test circuit into an integrated circuit, which is made up of a plurality of functional blocks interconnected, such that test data can be externally input to at least one of the functional blocks when the functional block is tested. The method includes the steps of: a) obtaining routing information by analyzing interconnection routes of the functional block based on information about the integrated circuit; and b) obtaining pin combination information including input and output pin connection information for the at least one functional block under test. The input pin connection information represents interconnection between an input pin of the functional block under test and an associated external test data input pin to be connected to the input pin. The output pin connection information represents interconnection between an output pin of the functional block under test and an associated external test data output pin to be connected to the output pin. The method further includes the step of c) inserting a test data input circuit and an input signal direction controller between the external test data input pin and the functional block under test. The test data input circuit is used for inputting test data through the external test data input pin to the input pin of the functional block under test in a test mode based on the pin combination information. The input signal direction controller is provided for enabling the external test data input pin, which functions as an output or bidirectional pin in a normal operation mode, to input the test data in the test mode. The method further includes the step of d) inserting a test data output circuit and an output signal direction controller between the functional block under test and the external test data output pin. The test data output circuit is used for outputting the test data to the external test data output pin through the output pin of the functional block under test in the test mode based on the pin combination information. The output signal direction controller is provided for enabling the external test data output pin, which functions as an input or bidirectional pin in the normal operation mode, to output the test data in the test mode. The method further includes the step of e) updating the routing information based on how the test data input or output circuit inserted is connected and outputting the updated routing information as testable integrated circuit information.

According to the third inserting method, the pin combination information including the input and output pin connection information, which represents which input or output pin of the functional block under test should be connected to each external test data input or output pin, can be created automatically based on the routing information of the integrated circuit. Thus, information about a testable integrated circuit including the test circuit can be obtained quickly without actually designing the test circuit to be inserted into the functional block under test. That is to say, routing information for testing the functional block can be created without performing a great deal of modification work manually. As a result, the number of design process steps can be further reduced. In addition, even if the external test data input pin functions as an output pin in the normal operation mode, the input pin can be used as a bidirectional pin by inserting the input signal direction controller thereto. Similarly, even if the external test data output pin functions as an input pin in the normal operation mode, the output pin can also be used as a bidirectional pin by inserting the output signal direction controller thereto. Thus, the inventive method is easily adaptable to an automated design process.

In one embodiment of the present invention, the step b) preferably includes estimating how long a signal delay of the integrated circuit will be with respect to a clock period after the integrated circuit has been laid out and then obtaining partitioning information for classifying each of the input and output pin connection information into a plurality of groups so as to reduce the signal delay in the normal mode. The step c) preferably includes inserting the test data input circuit into each said group based on the partitioning information. And the step d) preferably includes inserting the test data output circuit into each said group based on the partitioning information. In such an embodiment, the test circuits inserted can be laid out for the respective groups based on the positional relationship between the pins of the functional block and the external test data input and output pins laid out. As a result, efficiency of a layout design process can be improved.

In one embodiment of the present invention, the step b) preferably includes estimating how long a wire between adjacent ones of the functional blocks will be after the integrated circuit has been laid out and then obtaining the pin combination information so as to shorten a maximum or average wire length of the test data input and output circuits in the integrated circuit. In such an embodiment, it is possible to reduce the processing load of analyzing and modifying a signal delay on subsequent layout design process steps. As a result, efficiency of a layout design process can be improved.

In another embodiment of the present invention, the step b) preferably includes the steps of: estimating, based on the pin combination information, how long a wire length of the test data input or output circuit inserted will be after the integrated circuit has been laid out; deciding whether or not a signal shaping buffer should be added to the test data input or output circuit to shape a waveform of a signal that has been rounded during the propagation thereof; and defining a result of the decision as signal shaping buffer information. The step c) preferably includes inserting the signal shaping buffer into the test data input circuit based on the signal shaping buffer information. And the step d) preferably includes inserting the signal shaping buffer into the test data output circuit based on the signal shaping buffer information. In such an embodiment, a signal shaping buffer can be incorporated if necessary before a layout is defined, thus improving the efficiency of a layout design process.

In still another embodiment, the step b) preferably includes the steps of: estimating, based on the pin combination information, how long a signal delay of the integrated circuit will be with respect to the clock period thereof after the integrated circuit has been laid out; deciding whether or not a timing adjusting flip-flop should be added to the test data input or output circuit to prevent the integrated circuit from operating erroneously due to the signal delay; and defining a result of the decision as timing adjusting flip-flop information. The step c) preferably includes inserting the timing adjusting flip-flop into the test data input circuit based on the timing adjusting flip-flop information. And the step d) preferably includes inserting the timing adjusting flip-flop into the test data output circuit based on the timing adjusting flip-flop information. In such an embodiment, a timing adjusting flip-flop can be incorporated if necessary before a layout is defined, thus improving the efficiency of a layout design process.

A first exemplary converting method according to the present invention is adapted to convert block-by-block test data prepared for each of a plurality of functional blocks, which are interconnected together to form an integrated circuit, into test data of the type making the functional blocks in the integrated circuit externally testable. The method includes the step of a) obtaining pin allocation information including input and output pin connection information for the at least one of the functional blocks under test. The input pin connection information represents interconnection between an input pin of the functional block under test and an associated external test data input pin to be connected to the input pin. The output pin connection information represents interconnection between an output pin of the functional block under test and an associated external test data output pin to be connected to the output pin. The method further includes the steps of: b) obtaining machine-readable pin combination information by analyzing the pin allocation information; and c) converting the block-by-block test data into the test data for the integrated circuit based on the pin combination information.

According to the first converting method, the block-by-block test data prepared for each of the functional blocks is converted into test data making the integrated circuit testable based on the pin combination information obtained by the first inserting method of the present invention. Thus, test data of the type making the integrated circuit externally testable can be defined on the block-by-block basis. As a result, a test process can be carried out on a semiconductor integrated circuit made up of a plurality of functional blocks in a much shorter time.

A second exemplary converting method according to the present invention is adapted to convert block-by-block test data prepared for each of a plurality of functional-blocks, which are interconnected together to form an integrated circuit, into test data of the type making the functional blocks in the integrated circuit externally testable. The method includes the steps of: a) obtaining routing information by analyzing interconnection routes of the functional block based on information about the integrated circuit; and b) obtaining pin combination information including input and output pin connection information for at least one of the functional blocks under test. The input pin connection information represents interconnection between an input pin of the functional block under test and an associated external test data input pin to be connected to the input pin. The output pin connection information represents interconnection between an output pin of the functional block under test and an associated external test data output pin to be connected to the output pin. The method further includes the step of d) converting the block-by-block test data into the test data for the integrated circuit based on the pin combination information.

According to the second converting method, the block-by-block test data prepared for each of the functional blocks is converted into test data making the integrated circuit testable based on the pin combination information obtained by the second inserting method of the present invention. Thus, test data of the type making the integrated circuit externally testable can be defined quickly on the basis of the functional blocks included in the integrated circuit.

DESCRIPTION OF THE PREFERRED EMBODIMENTS

Embodiment 1

Hereinafter, a first exemplary embodiment of the present invention will be described with reference to the accompanying drawings.

Figure 1:
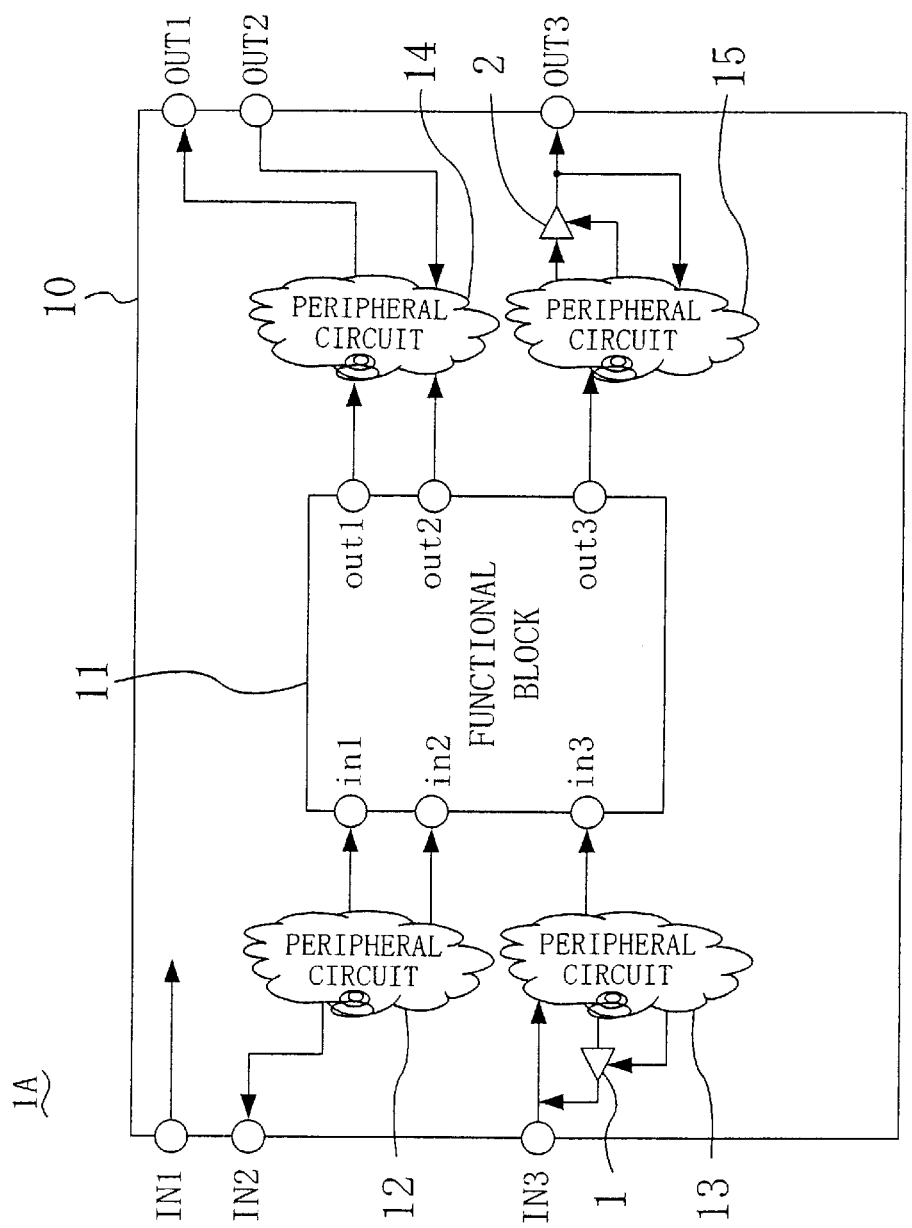
FIG. 1 is a block diagram illustrating a semiconductor integrated circuit, to which a test circuit inserting method according to a first embodiment of the present invention is applicable, before a test circuit is inserted thereto.

FIG. 1 illustrates an arrangement of blocks in a semiconductor integrated circuit, to which a test circuit inserting method according to the first embodiment is applicable, before a test circuit is inserted thereto. As shown in FIG. 1, a functional block 11, which includes first, second and third input pins in1, in2 and in3 and first, second and third output pins out1, out2 and out3, is placed within a placement region 10 of the semiconductor integrated circuit 1A. First, second, third and fourth peripheral circuits 12, 13, 14 and 15 are also placed within the placement region 10. Specifically, the first peripheral circuit 12 is connected to the first and second input pins in1 and in2 of the functional block 11. The second peripheral circuit 13 is connected to the third input pin in3 thereof. The third peripheral circuit 14 is connected to the first and second output pins out1 and out2 thereof. And the fourth peripheral circuit 15 is connected to the third output pin out3 thereof. In this case, the peripheral circuits 12 through 15 themselves may be respective functional blocks.

The placement region 10 is further provided with first, second and third external pins IN1, IN2 and IN3, which function as input, output and bidirectional pins, respectively, in a normal operation mode. The placement region 10 is further provided with fourth, fifth and sixth external pins OUT1, OUT2 and OUT3, which function as output, input and bidirectional pins, respectively, in the normal operation mode. The fourth and fifth external pins OUT1 and OUT2 are connected to the third peripheral circuit 14, while the sixth external pin OUT3 is connected to the fourth peripheral circuit 15.

A first tristate buffer 1 is connected between the second peripheral circuit 13 and the third external pin IN3, is controlled by the second peripheral circuit 13 and regulates the input and output at the third external pin IN3. A second tristate buffer 2 is connected between the fourth peripheral circuit 15 and the sixth external pin OUT3, is controlled by the fourth peripheral circuit 15 and regulates the input and output at the sixth external pin OUT3.

It is noted that the functional block 11 and these peripheral circuits (or functional blocks) 12 through 15 are placed within the placement region 10 only provisionally and has not been definitely laid out yet.

Hereinafter, it will be described how to insert a test circuit into the semiconductor integrated circuit 1A with such an arrangement.

Figure 2:
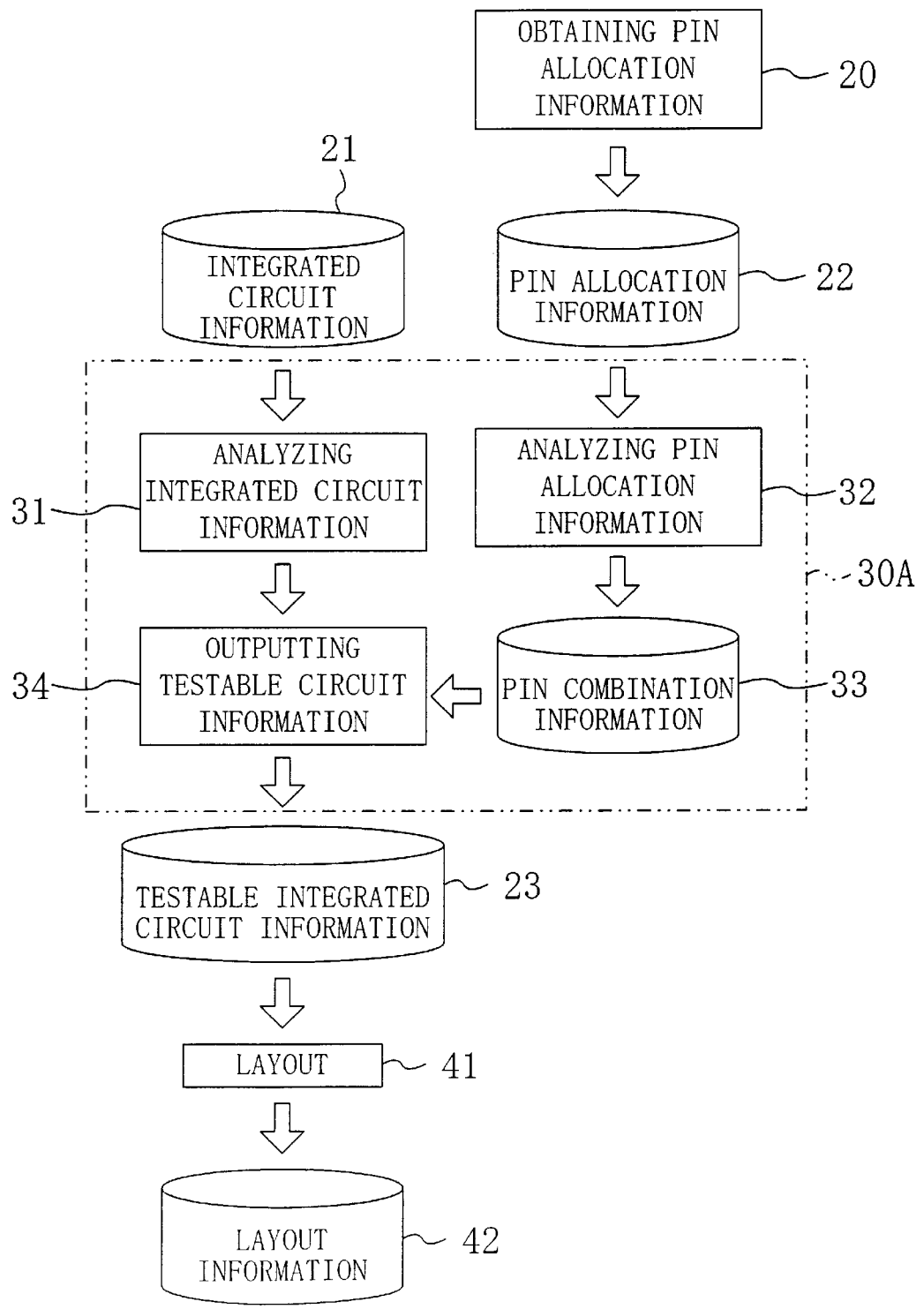
FIG. 2 is a flowchart illustrating a test circuit inserting method according to the first and second embodiments of the present invention.

FIG. 2 illustrates a conceptual processing flow of a test circuit inserting method according to the first embodiment. First, integrated circuit information 21 is prepared as shown in FIG. 2. The integrated circuit information 21 describes the specifications of the semiconductor integrated circuit 1A shown in FIG. 1 at gate or register transfer level (RTL). Alternatively, in Step 20 of obtaining pin allocation information, pin allocation information 22 is prepared as also shown in FIG. 2. The pin allocation information 22 includes: input pin connection information representing which input pin of the functional block under test should be connected to which external pin; and output pin connection information representing which output pin of the functional block under test should be connected to which external pin. In the illustrated example, the pin allocation information 22 may be defined by machine-readable (i.e., computer-readable) file formats, e.g., a file created with a screen editor.

The following Table 1 illustrates exemplary pin allocation information 22 defined for the semiconductor integrated circuit 1A shown in FIG. 1.

TABLE 1

| Test Mode | External Pin | Functional Block Pin |
|---|---|---|
| T | IN1 | in1 |
| T | IN2 | in2 |
| T | IN3 | in3 |
| T | OUT1 | out1 |
| T | OUT2 | out2 |
| T | OUT3 | out3 |

In Table 1, the pin allocation information 22 indicates that a pair of pins on each row should be connected together. In the illustrated example, the external pins IN1, IN2 and IN3, to which test data is input in the test mode T, are connected to the respective input pins in1, in2 and in3 of the functional block 11 under test. On the other hand, the external pins OUT1, OUT2 and OUT3, from which expected values are output as test results, are connected to the respective output pins out1, out2 and out3 of the functional block 11 under test.

Hereinafter, a test circuit inserting process 30A shown in FIG. 2 will be described.

First, in Step 31 of analyzing the integrated circuit information 21, the integrated circuit information 21 is retrieved and the structure of the integrated circuit 1A is analyzed, thereby creating routing information for each functional block.

Next, in Step 32 of analyzing the pin allocation information 22, the pin allocation information 22 is retrieved and the contents thereof are analyzed, thereby creating pin combination information 33 with a computer-processable data structure. This process step 32 is equivalent to so-called compilation processing. The result of the analysis may be output as the following list structure (1), for example:

(T(IN1 in1)(IN2 in2)(IN3 in3)(OUT1 out1)(OUT2 out2)(OUT3 out3))    (1)

In this list, the sign T at the beginning indicates the test mode and the first and second terms of each of the six data pairs following the sign T represent the names of an external pin and an associated pin of the functional block 11, respectively. In the illustrated embodiment, the pin combination information 33 is output as a file to an external component. Alternatively, the information 33 may be stored as it is in machine code (e.g., binary code) within internal storage.

Then, in Step 34 of outputting testable circuit information, information 23 about a testable integrated circuit is created by adding information about a test data input or output circuit and input or output signal direction controller to the routing information defined in Step 31 with reference to the pin combination information 33 and output.

Subsequently, in a layout step 41, the layout of the testable integrated circuit is defined based on the testable integrated circuit information 23 output, thereby obtaining layout information 42.

Figure 3:
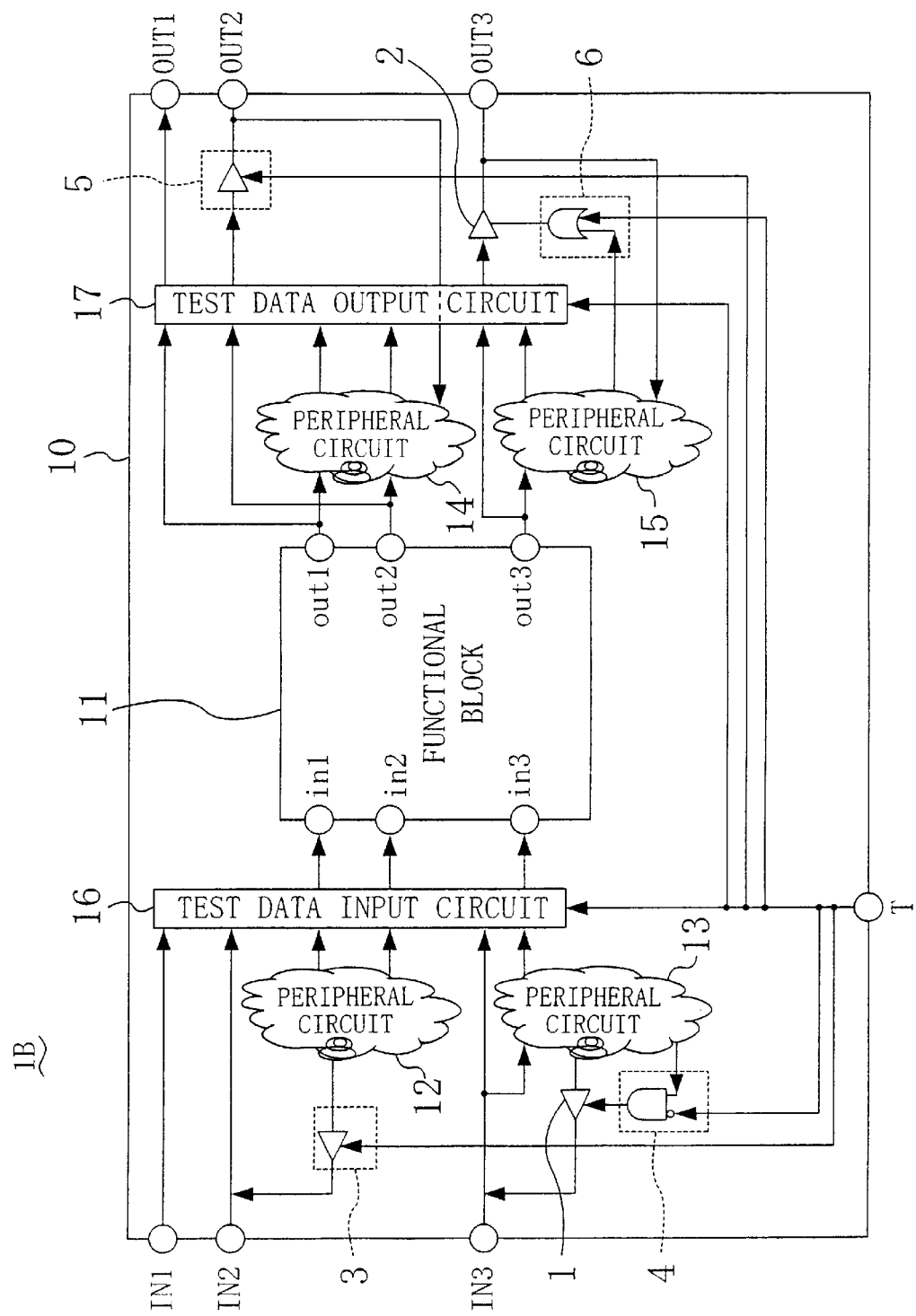
FIG. 3 is a block diagram illustrating a testable semiconductor integrated circuit according to first through fifth embodiments of the present invention.

FIG. 3 illustrates a testable semiconductor integrated circuit 1B as represented by the testable integrated circuit information 23. In FIG. 3, the same components as those illustrated in FIG. 1 are identified by the same reference numerals and the description thereof will be omitted herein. As shown in FIG. 3, a test data input circuit 16 is inserted between the first and second peripheral circuits 12, 13 and the input pins of the functional block 11. A test data output circuit 17 is inserted between the third and fourth peripheral circuits 14, 15 and the external pins OUT1, OUT2 and OUT3.

The test data input circuit 16 is connected to a mode signal input pin T, at which a mode signal specifying the operation mode of the testable semiconductor integrated circuit 1B is received. Also, the test data input circuit 16 receives signals from the external pins IN1, IN2 and IN3 and from the first and second peripheral circuits 12 and 13 and then outputs these signals to the respective input pins in1, in2 and in3 of the functional block 11.

The test data output circuit 17 is also connected to the mode signal input pin T. And the test data output circuit 17 receives signals from the output pins out1, out2 and out3 of the functional block 11 and from the third and fourth peripheral circuits 14 and 15 and then outputs these signals to the respective external pins OUT1, OUT2 and OUT3.

A tristate buffer 3 is inserted as a first input signal direction controller between the first peripheral circuit 12 and the second external pin IN2. The first input signal direction controller 3 has its input, output and control terminals connected to the first peripheral circuit 12, the second external pin IN2 and the mode signal input pin T. When the mode signal T received through the mode signal input pin T is logically high, the controller 3 disables the output of a signal from the first peripheral circuit 12 to the second external pin IN2, thereby enabling the input of a signal from the second external pin IN2 to the test data input circuit 16.

An AND gate 4 with an inverting input terminal is inserted as a second input signal direction controller between the second peripheral circuit 13 and a first tristate buffer 1. The second input signal direction controller 4 has one of its input terminals connected to the mode signal input pin T, the other input terminal thereof connected to the second peripheral circuit 13 and the output terminal thereof connected to the control terminal of the first tristate buffer 1. When the mode signal T is logically high, the controller 4 controls the first tristate buffer 1 to disable the output of a signal from the second peripheral circuit 13 to the third external pin IN3 and thereby enable the input of a signal from the third external pin IN3 to the test data input circuit 16.

Another tristate buffer 5 is inserted as a first output signal direction controller between the fifth external pin OUT2 and the test data output circuit 17. The first output signal direction controller 5 has its input, output and control terminals connected to the test data output circuit 17, the fifth external pin OUT2 and the mode signal input pin T. When the mode signal T is logically high, the controller 5 disables the input of a signal from the fifth external pin OUT2 to the third peripheral circuit 14, thereby enabling the output of a signal from the test data output circuit 17 to the fifth external pin OUT2.

An OR gate 6 is inserted as a second output signal direction controller between the fourth peripheral circuit 15 and a second tristate buffer 2. The second output signal direction controller 6 has one of its input terminals connected to the mode signal input pin T, the other input terminal thereof connected to the fourth peripheral circuit 15 and the output terminal thereof connected to the control terminal of the second tristate buffer 2. When the mode signal T is logically high, the controller 6 controls the second tristate buffer 2 to disable the input of a signal from the sixth external pin OUT3 to the fourth peripheral circuit 15 and thereby enable the output of a signal from the test data output circuit 17 to the sixth external pin OUT3.

Figure 4:
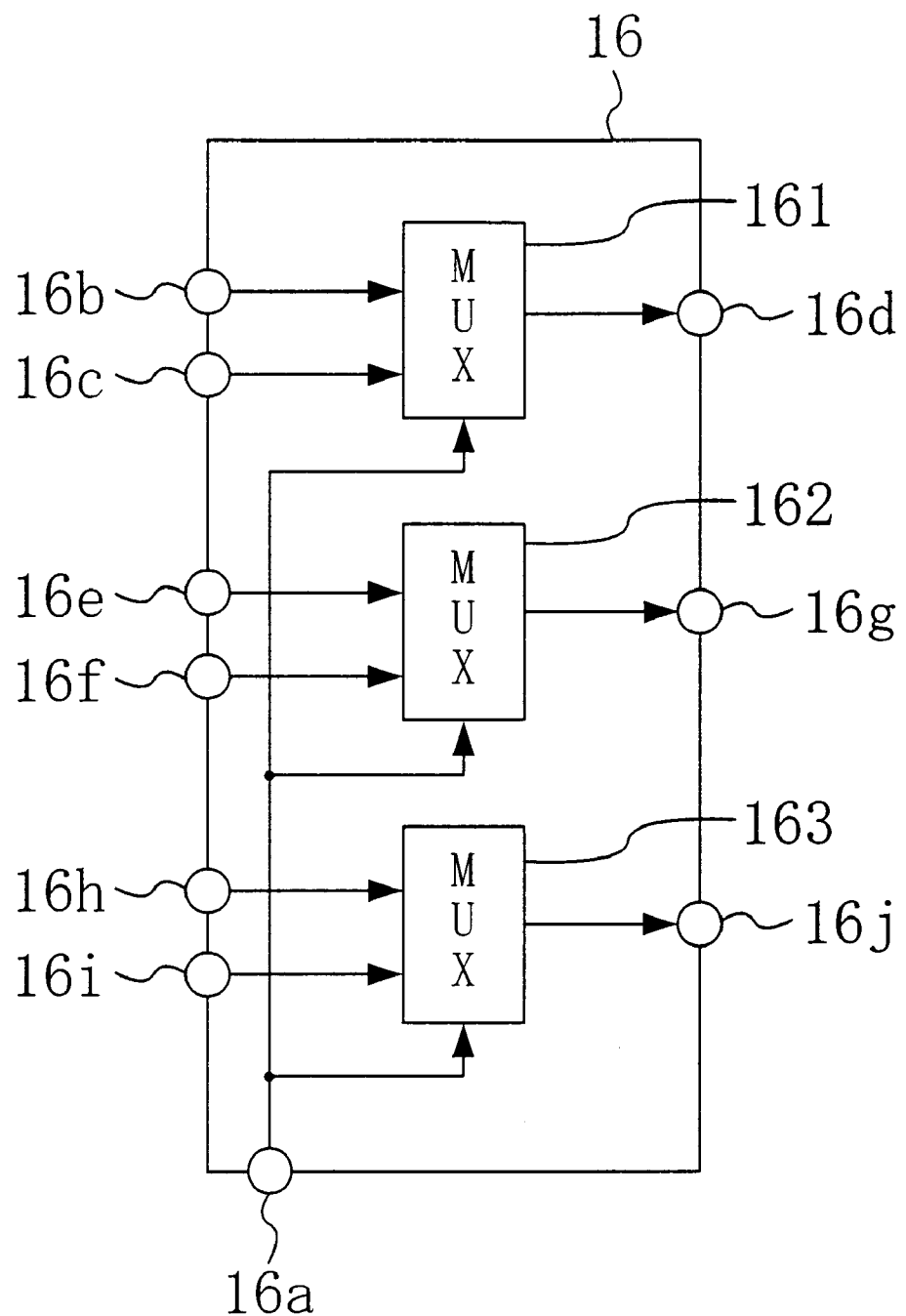
FIG. 4 is a circuit diagram illustrating a test data input circuit according to the first embodiment.
Figure 5:
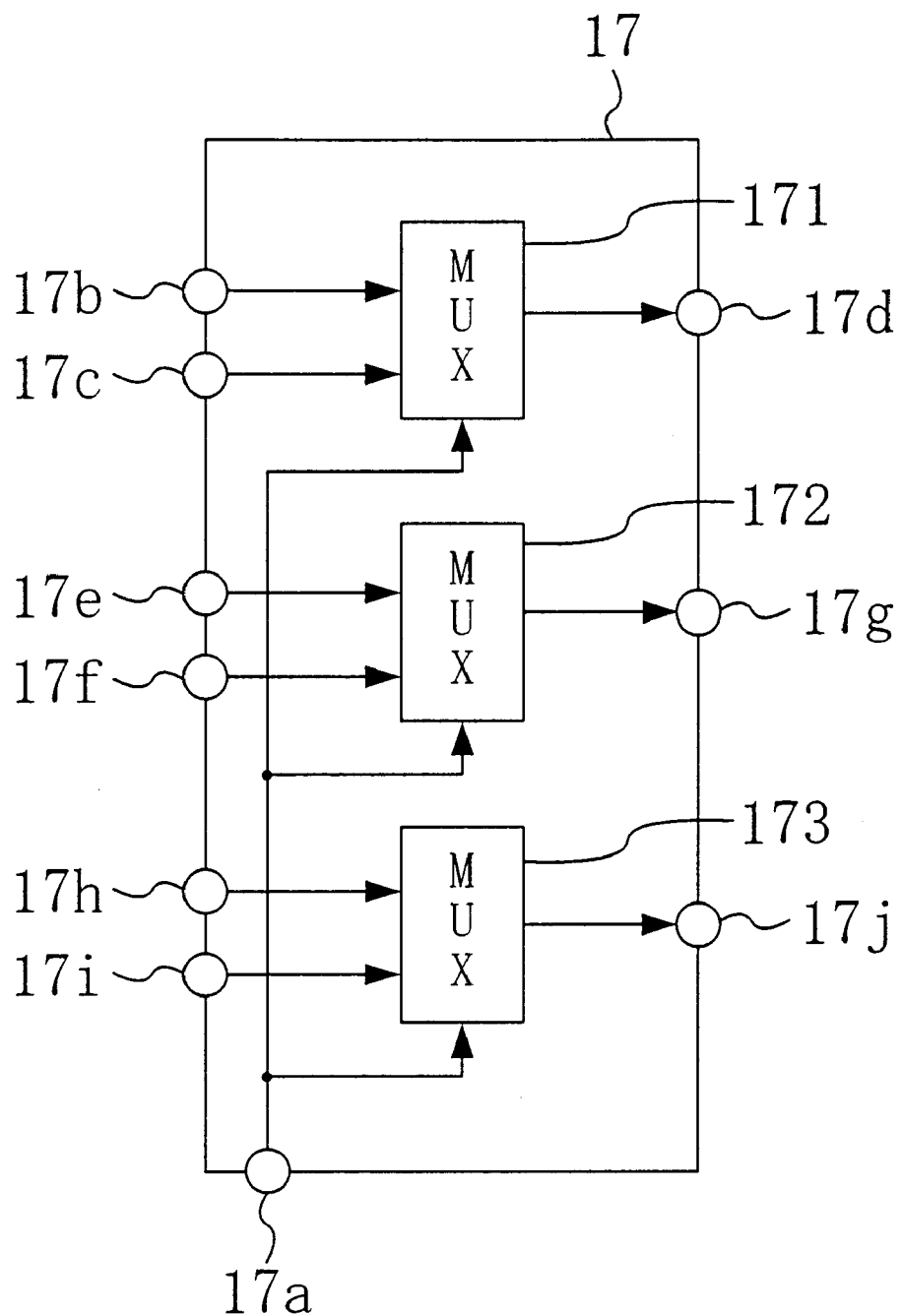
FIG. 5 is a circuit diagram illustrating a test data output circuit according to the first embodiment.

FIGS. 4 and 5 illustrate respective detailed configurations of the test data input and output circuits 16 and 17.

As shown in FIG. 4, the test data input circuit 16 includes first, second and third selectors 161, 162 and 163 connected to a first input pin 16a, at which the mode signal is received from the mode signal input pin T.

The first selector 161 includes second and third input pins 16b, 16c and a first output pin 16d, which may be connected to the first external pin IN1, the first peripheral circuit 12 and the first input pin in1 of the functional block 11, respectively.

The second selector 162 includes fourth and fifth input pins 16e, 16f and a second output pin 16g, which may be connected to the second external pin IN2, the first peripheral circuit 12 and the second input pin in2 of the functional block 11, respectively.

The third selector 163 includes sixth and seventh input pins 16h, 16i and a third output pin 16j, which may be connected to the third external pin IN3, the second peripheral circuit 13 and the third input pin in3 of the functional block 11, respectively.

If the mode signal T is high, i.e., in the test mode, then the input signals received from the respective external pins IN1, IN2 and IN3 are selected by the selectors 161, 162 and 163, respectively, in the test data input circuit 16. Alternatively, if the mode signal T is low, i.e., in the normal operation mode, then the signal lines extending from the first and second peripheral circuits 12 and 13 are selected by the selectors 161, 162 and 163.

As shown in FIG. 5, the test data output circuit 17 includes first, second and third selectors 171, 172 and 173 connected to a first input pin 17a, at which the mode signal T is received from the mode signal input pin T.

The first selector 171 includes second and third input pins 17b, 17c and a first output pin 17d, which may be connected to the first output pin out1 of the functional block 11, the third peripheral circuit 14 and the fourth external pin OUT1, respectively.

The second selector 172 includes fourth and fifth input pins 17e, 17f and a second output pin 17g, which may be connected to the second output pin out2 of the functional block 11, the third peripheral circuit 14 and the fifth external pin OUT2, respectively.

The third selector 173 includes sixth and seventh input pins 17h, 17i and a third output pin 17g, which may be connected to the third output pin out3 of the functional block 11, the fourth peripheral circuit 15 and the sixth external pin OUT3, respectively.

If the mode signal T is high, i.e., in the test mode, then the output signals from the respective output pins out1, out2 and out3 of the functional block 11 are selected by the selectors 171, 172 and 173, respectively, in the test data output circuit 17. Alternatively, if the mode signal T is low, i.e., in the normal operation mode, then the signal lines extending from the third and fourth peripheral circuits 14 and 15 are selected by the selectors 171, 172 and 173.

In this case, none of the selectors 161 through 163 shown in FIG. 4 and none of the selectors 171 through 173 shown in FIG. 5 have been definitely laid out yet. FIGS. 4 and 5 just represent appropriate interconnection routes among the pins.

As described above, only by preparing the pin allocation information 22 shown in Table 1, the test data input and output circuits 16 and 17 can be inserted easily and appropriately between the functional block 11 in the semiconductor integrated circuit 1A and the external pins IN1 through IN3 and between the block 11 and the external pins OUT1 through OUT3, respectively. Thus, according to this embodiment, the functional block 11 can be tested externally with the number of processing steps drastically cut down.

According to this embodiment, the pin allocation information 22 should be prepared manually. For example, if the integrated circuit information 21 includes gate-level descriptions, then the information 21 is ordinarily made up of netlists written in a sort of programming language. Thus, compared to editing the netlists themselves using a screen editor, for example, the editing work is much less complicated and results in a far smaller number of editing errors.

Also, even if the interconnection routes between the external pins of the semiconductor integrated circuit 1A and the pins of the functional block have been modified, the testable integrated circuit information 23 can be revised easily only by changing the description of the pin allocation information 22.

Moreover, as exemplified above, the output pins of the functional block may be external bidirectional pins, and even external input pins can also output data therethrough if the input pins are replaced with bidirectional pins using the output signal direction controller. Similarly, the input pins of the functional block may be external bidirectional pins, and even external output pins can also input data therethrough if the output pins are replaced with bidirectional pins using the input signal direction controller.

In the foregoing embodiment, the pin allocation information representing interconnection routes between the external pins and associated pins of the functional block is provided as a table. Alternatively, the information may be supplied as commands or in a programming language.

Furthermore, the semiconductor integrated circuit 1A may be just a part of a semiconductor integrated circuit of a larger scale.

Embodiment 2

Hereinafter, a second exemplary embodiment of the present invention will be described with reference to the accompanying drawings.

The following Table 2 illustrates exemplary pin allocation information 22A used in a test circuit inserting method according to the second embodiment. In this embodiment, the semiconductor integrated circuit 1A shown in FIG. 1 is also tested.

TABLE 2

| Test Mode | External Pin | Functional Block Pin | Group 22a | BUF 22b | FF 22c |
|---|---|---|---|---|---|
| T | IN1 | in1 | A | 0 | 1 |
| T | IN2 | in2 | A | 0 | 0 |
| T | IN3 | in3 | B | 1 | 0 |
| T | OUT1 | out1 | C | 0 | 1 |
| T | OUT2 | out2 | C | 0 | 0 |
| T | OUT3 | out3 | D | 1 | 0 |

The second embodiment is different from the first embodiment in that the pin allocation information 22A additionally includes partitioning information 22a, signal shaping buffer information BUF 22b and timing adjusting flip-flop information FF 22c. In Table 2, "0" indicates that no buffers or flip-flops are added and "1" indicates that a buffer or flip-flop is added.

The partitioning information 22a partitions the input pin connection information defined between the external pins IN1 through IN3 and the input pins in1 through in3 of the first functional block 11 and the output pin connection information defined between the external pins OUT1 through OUT3 and the output pins out1 through out3 of the functional block 11 into respective groups. In this manner, all the test circuits belonging to the same group can be placed at a time in a subsequent layout step. Thus, the layout can be optimized quickly. In the illustrated example, the first and second external pins IN1 and IN2 are classified as Group A, the third external pin IN3 Group B, the fourth and fifth external pins OUT1 and OUT2 Group C and the sixth external pin OUT3 Group D, respectively, as shown in Table 2.

In Table 2, the signal shaping buffer information 22b indicates whether or not a buffer should be added in a subsequent layout step to correct the rounded edge of a signal waveform when a wire length of a test circuit inserted is long. The timing adjusting flip-flop information 22c indicates whether or not a flip-flop should be added to propagate test data at a predetermined clock frequency when the test data cannot be propagated at the frequency due to wiring delay. If flip-flops are inserted, then the count of the clock pulse increases by the number of the flip-flops inserted, but a test can be carried out at the designated clock frequency.

Hereinafter, it will be described with reference to the conceptual processing flow shown in FIG. 2 how to make the semiconductor integrated circuit 1A testable using the pin allocation information 22A prepared.

First, in Step 31 of analyzing the integrated circuit information 21, the integrated circuit information 21 is retrieved and the structure of the integrated circuit 1A is analyzed, thereby defining routing information for each functional block.

Next, in Step 32 of analyzing the pin allocation information 22A, the pin allocation information 22A is retrieved and the contents thereof are analyzed, thereby outputting the analysis result as pin combination information 33. The result of the analysis may be output as the following list structure (2), for example:

(T(IN1 in1 A 0 1)(IN2 in2 A 0 0)(IN3 in3 B 1 0)(OUT1 out1 C 0 1)(OUT2 out2 C 0 0)(OUT3 out3 D 1 0)  (2)

The list structure (2) is different from the list structure (1) in that a set of items representing the partitioning information, signal shaping buffer information and timing adjusting flip-flop information in this order are added to each pair of data items about an external pin and an associated pin of the functional block.

Then, in Step 34 of outputting testable circuit information, information 23 about a testable integrated circuit is created by adding information about a test data input or output circuit and input or output signal direction controller to the routing information analyzed in Step 31 with reference to the pin combination information 33 and output.

Subsequently, in the layout step 41, the layout of the testable integrated circuit is defined based on the testable integrated circuit information 23 output, thereby obtaining the layout information 42. As a result, the testable semiconductor integrated circuit 1B represented by the testable integrated circuit information 23 is obtained as shown in FIG. 3.

Figure 6:
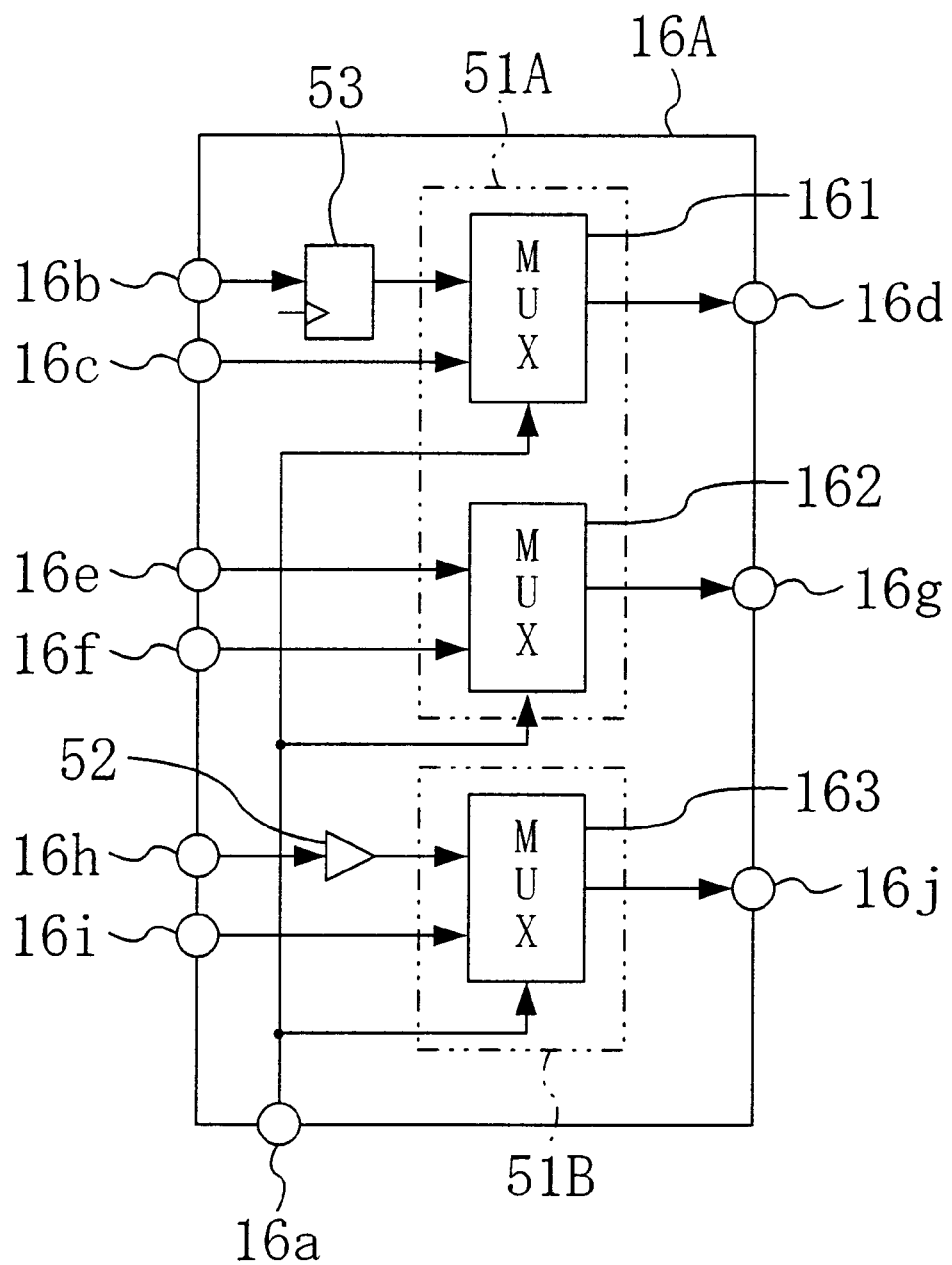
FIG. 6 is a circuit diagram illustrating a test data input circuit according to the second embodiment.
Figure 7:
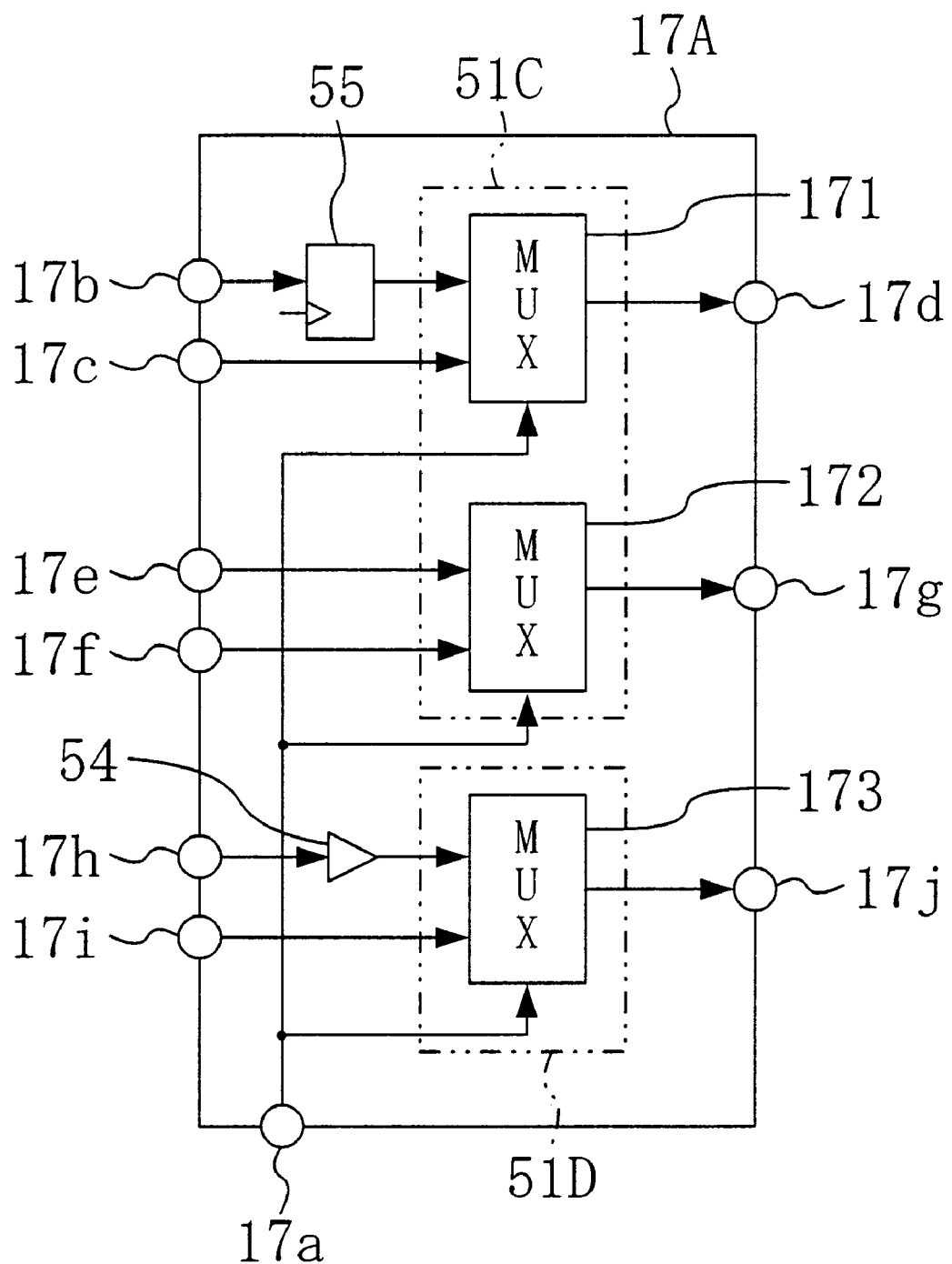
FIG. 7 is a circuit diagram illustrating a test data output circuit according to the second embodiment.

FIGS. 6 and 7 illustrate respective detailed configurations of test data input and output circuits 16A and 17A according to the second embodiment. In FIGS. 6 and 7, the same components as those illustrated in FIGS. 4 and 5 are identified by the same reference numerals and the description thereof will be omitted herein.

In the test data input circuit 16A shown in FIG. 6, the first and second selectors 161 and 162 are included in a first functional block 51A corresponding to Group A, while the third selector 163 is included in a second functional block 51B corresponding to Group B based on the partitioning information 22a of the pin allocation information 22A.

Also, based on the signal shaping buffer information 22b of the pin allocation information 22A, a first buffer 52 is inserted between the sixth input pin 16h and the third selector 163. Furthermore, based on the timing adjusting flip-flop information 22c of the pin allocation information 22A, a first flip-flop 53 is inserted between the second input pin 16b and the first selector 161.

Similarly, in the test data output circuit 17A shown in FIG. 7, the first and second selectors 171 and 172 are included in a third functional block 51C corresponding to Group C, while the third selector 173 is included in a fourth functional block 51D corresponding to Group D based on the partitioning information 22a of the pin allocation information 22A.

Also, based on the signal shaping buffer information 22b, a second buffer 54 is inserted between the sixth input pin 17h and the third selector 173. Furthermore, based on the timing adjusting flip-flop information 22c, a second flip-flop 55 is inserted between the second input pin 17b and the first selector 171.

As can be seen, according to this embodiment, the partitioning information 22a is added to the pin allocation information 22A, thereby classifying the test data input and output circuits 16, 17 into a plurality of groups such that each group can be moved collectively at the layout step. Thus, the efficiency of design process can be improved.

Generally speaking, when the layout of an integrated circuit is defined, an automated layout process is carried out on a group basis, i.e., by classifying the components of the integrated circuit into a plurality of groups, so as to realize desired placement area and operation timing efficiently. Accordingly, if the number of pins of a functional block is on the order of several hundreds, several thousands or more, then an enormous number of components are included in the test data input or output circuit, e.g., selectors, buffers and flip-flops. In such a situation, processing errors are much more likely to be committed a considerable number of times.

Accordingly, if the components of the test data input or output circuit are classified into a plurality of groups in advance, then the number of process steps of the automated layout process and the number of possible errors can be both cut down.

Also, in performing the automated layout process, a group in the test data input or output circuit may be combined with another group to make up a new one. In such a case, a new group can be formed easily by combining several groups together. Thus, compared to forming a group by specifying the components of the test data input or output circuit one by one, the number of layout process steps can be reduced and errors are much less likely to be committed.

In addition, since the signal shaping buffer information 22b is added to the pin allocation information 22A according to this embodiment, a signal shaping buffer can be selectively inserted into an interconnection route for propagating the test data therethrough. Accordingly, a test circuit, which is adaptable to even a large-scale semiconductor integrated circuit, can be formed easily and just as intended.

Moreover, since the timing adjusting flip-flop information 22c is added to the pin allocation information 22A according to this embodiment, a timing adjusting flip-flop can be selectively inserted into an interconnection route for propagating the test data therethrough. Accordingly, the wiring delay can be reduced, and therefore the test data can be transmitted to the functional block under test at a predetermined clock frequency.

As can be seen, if the signal shaping buffer or timing adjusting flip-flop information is added in advance to the integrated circuit information, then there is no need to add or insert a buffer or flip-flop or define a layout over again when desired timing relationship is not realized in automated layout process.

In the foregoing embodiment, the signal shaping buffer or the timing adjusting flip-flop is inserted into the input end of the test data input or output circuit 16 or 17. Alternatively, if identification information is further added to the pin allocation information 22A to identify the input and output ends from each other, then the buffer or flip-flop may be selectively inserted into the output end.

Embodiment 3

Hereinafter, a third exemplary embodiment of the present invention will be described with reference to the accompanying drawings.

Figure 8:
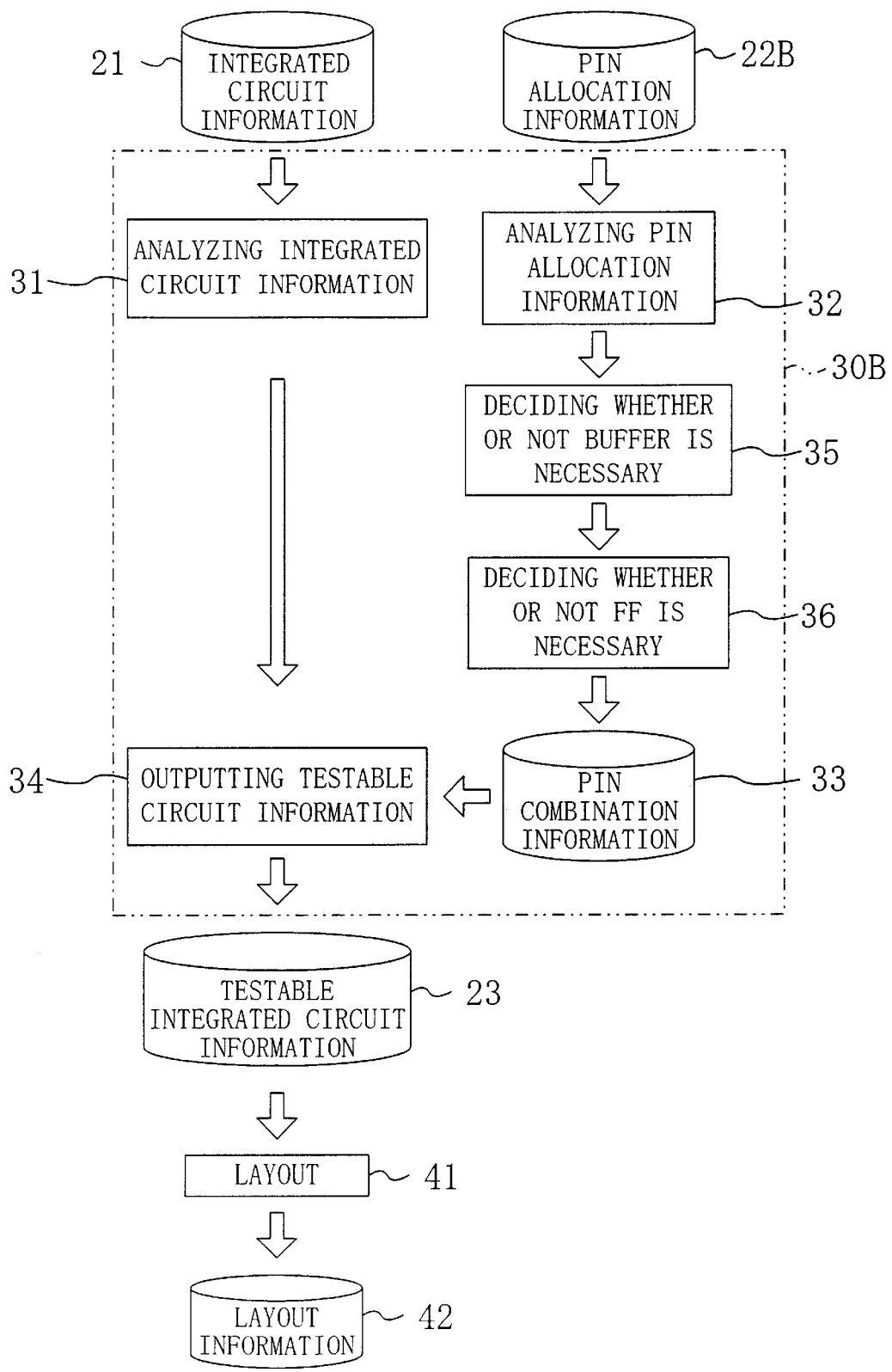
FIG. 8 is a flowchart illustrating a test circuit inserting method according to a third embodiment of the present invention.

FIG. 8 illustrates a conceptual processing flow of a test circuit inserting method according to the third embodiment. As shown in FIG. 8, a test circuit inserting procedure 30B according to the third embodiment is characterized by further including Steps 35 and 36 of deciding whether or not a buffer or flip-flop (FF) is necessary after Step 32 of analyzing the pin allocation information 22B. That is to say, although it is up to the designer to decide whether or not the signal shaping buffer or timing adjusting flip-flip is necessary according to the second embodiment, these decisions are made automatically by a machine according to the third embodiment.

The following Table 3 represents pin allocation information 22B according to the third embodiment, which includes only the partitioning information 22a in addition to the pin combination information:

TABLE 3

| Test Mode | External Pin | Functional Block Pin | Group 22a |
|---|---|---|---|
| T | IN1 | in1 | A |
| T | IN2 | in2 | A |
| T | IN3 | in3 | B |
| T | OUT1 | out1 | C |
| T | OUT2 | out2 | C |
| T | OUT3 | out3 | D |

Hereinafter, the test circuit inserting procedure 30B shown in FIG. 8 will be described. In FIG. 8, the same blocks as those illustrated in FIG. 2 are identified by the same reference numerals and the description thereof will be omitted herein.

First, in Step 31 of analyzing the integrated circuit information 21, the integrated circuit information 21 is retrieved and the structure of the integrated circuit 1A is analyzed, thereby defining routing information for each functional block.

Next, in Step 32 of analyzing the pin allocation information 22B, the pin allocation information 22B is retrieved and the contents thereof are analyzed, thereby outputting the result of the analysis as the following list structure (3), for example:

$$(T(IN1\ in1\ A)(IN2\ in2\ A)(IN3\ in3\ B)(OUT1\ out1\ C)(OUT2\ out2\ C)(OUT3\ out3\ D)) \quad (3)$$

The list structure (3) is different from the list structure (1) in that an associated group name, which is an item of the partitioning information, is added to each pair of data items in the list structure (1).

Next, in Step 35 of deciding whether or not a buffer is necessary, it is expected what the layout of the integrated circuit will be like after the test circuit has been inserted thereto. The degree of signal waveform roundness is estimated based on the expected result. And it is determined whether or not a buffer should be added to the transmission line of the test data. If the answer is YES, then the signal shaping buffer information representing the locations of buffers needed is added to the analysis result of the list structure (3). For example, suppose the estimated signal waveform roundness values exceed the prescribed ones in the transmission line between the third external pin IN3 and the third input pin in3 of the functional block 11 and in the transmission line between the sixth external pin OUT3 and the third output pin out3 of the functional block 11.

Subsequently, in Step 36 of deciding whether or not a flip-flop is necessary, it is expected what the layout of the integrated circuit will be like after the test circuit has been inserted thereto. The signal delay is estimated based on the expected result. And it is determined whether or not a timing adjusting flip-flop should be added to the transmission line of the test data. If the answer is YES, then the timing adjusting flip-flop information representing the locations of flip-flops needed is added to the analysis result of the list structure (3). For example, suppose the estimated signal delays exceed the prescribed ones in the transmission line between the first external pin IN1 and the first input pin in1 of the functional block 11 and in the transmission line between the fourth external pin OUT1 and the first output pin out1 of the functional block 11.

To estimate the degree of signal waveform roundness or the signal delay, known signal waveform roundness estimating tool and delay estimating tool may be used, respectively.

Also, Steps 35 and 36 do not have to be performed in this order, but may be carried out in the reversed order.

As a result of Steps 35 and 36, the pin combination information 33 is created as the following list structure (4):

$$(T(IN1\ in1\ A\ 0\ 1)(IN2\ in2\ A\ 0\ 0)(IN3\ in3\ B\ 1\ 0)(OUT1\ out1\ C\ 0\ 1)(OUT2\ out2\ C\ 0\ 0)(OUT3\ out3\ D\ 1\ 0)) \quad (4)$$

According to the third embodiment, the list structure (4) is supposed to have the same data items as those of the list structure (2) of the second embodiment for the sake of simplicity. Thus, the same semiconductor integrated circuit as the circuit 1B shown in FIG. 3 is formed in accordance with the testable integrated circuit information 23 created in Step 34 of outputting testable integrated circuit information. Also, the same test data input and output circuits as those 16A and 17A shown in FIGS. 6 and 7 are inserted.

According to this embodiment, even if the circuit designer cannot decide whether or not the signal shaping buffer or timing adjusting flip-flop should be inserted, the testable integrated circuit information 23, indicating appropriate locations of the buffer or flip-flop inserted, can be obtained. Accordingly, the resultant testable integrated circuit information 23 is adaptable non-manually to a large-scale semiconductor integrated circuit and the integrated circuit is testable in synchronism with a predetermined clock signal.

Embodiment 4

Hereinafter, a fourth exemplary embodiment of the present invention will be described with reference to the accompanying drawings.

Figure 9:
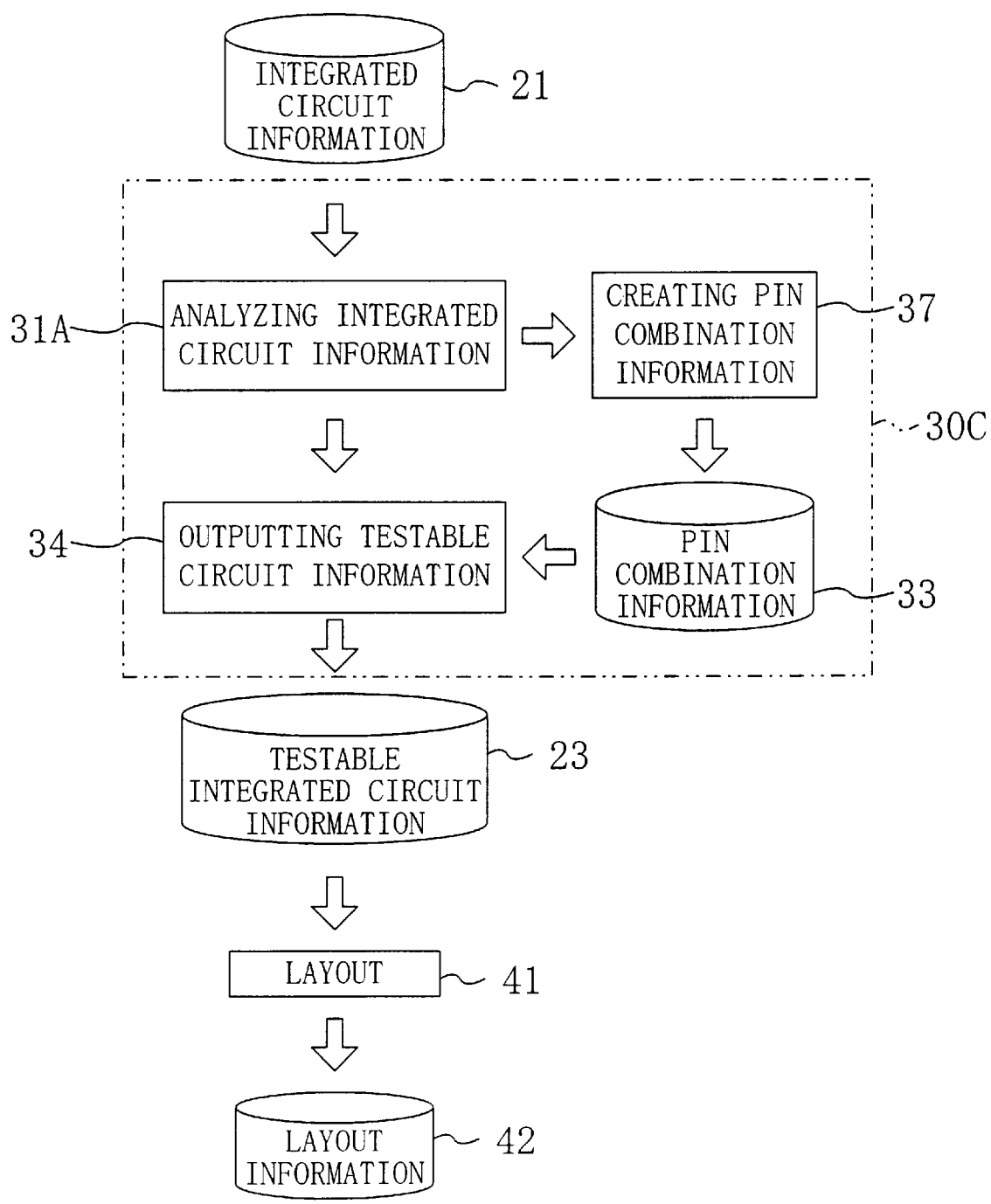
FIG. 9 is a flowchart illustrating a test circuit inserting method according to a fourth embodiment of the present invention.

FIG. 9 illustrates a conceptual processing flow of a test circuit inserting method according to the fourth embodiment. In FIG. 9, the same blocks as those illustrated in FIG. 2 are identified by the same reference numerals and the description thereof will be omitted herein. In the foregoing first, second and third embodiments, the pin allocation information 22, 22A, 22B is created manually. In contrast, the pin allocation information is created automatically according to the fourth embodiment.

Hereinafter, a test circuit inserting procedure 30C for inserting a test circuit into the semiconductor integrated circuit 1A shown in FIG. 1 and creating testable integrated circuit information will be described.

First, in Step 31A of analyzing the integrated circuit information 21, the integrated circuit information 21 is retrieved and the structure of the integrated circuit 1A is analyzed as shown in FIG. 9, thereby defining routing information for each functional block.

Next, in Step 37, the pin combination information 33 is created based on the routing information. The pin combination information 33 includes input and output pin connection information. The input pin connection information is defined between the input pins in1, in2 and in3 of the functional block 11 and the respective external pins IN1, IN2 and IN3. The output pin connection information is defined between the output pins out1, out2 and out3 of the functional block 11 and the respective external pins OUT1, OUT2 and OUT3.

According to the fourth embodiment, the pin combination information 33 is created automatically. Thus, there is no need to allocate the input pins in1 through in3 of the functional block 11 to the external pins IN1 through IN3 or the output pins out1 through out3 of the functional block 11 to the external pins OUT1 through OUT3.

Specifically, Step 37 of creating the pin combination information 33 includes the sub-steps of:

(1) estimating how long the wires connecting the test data input and output circuits to associated components will be after the integrated circuit has been laid out, and defining respective routes between the external pins of the semiconductor integrated circuit and the associated pins of the functional block so as to reduce the maximum wire length;

(2) estimating how long the signal delay will be after the test circuits have been inserted and partitioning each of the test circuits into a predetermined number of groups to reduce the signal delay in the normal operation mode after the sub-step (1) has been performed;

(3) estimating how long the wires will be after the integrated circuit has been laid out, deciding whether or not the signal shaping buffers should be inserted and then adding the decision result as the signal shaping buffer information to the pin combination information 33 after the sub-step (1) has been performed; and (4) estimating how long the signal delay of the integrated circuit will be after the circuit has been laid out, deciding whether or not the timing adjusting flip-flops should be inserted if the transmission of the test data is delayed considerably with respect to the clock period and then adding the decision result as the timing adjusting flip-flop information to the pin combination information 33 after the sub-step (1) has been performed.

In the illustrated embodiment, the following combinations are supposed to be considered the best as a result of the sub-step (1) of estimating the wire length in the pin combination information creating step 37. Specifically, the longest delay of the signal line, through which the test data is transmitted, is supposed to be sufficiently short on the input end when the first, second and third input pins in1, in2 and in3 of the functional block 11 are combined with the first, second and third external pins IN1, IN2 and IN3, respectively. On the output end, the longest delay of the signal line, through which the test data is transmitted, is supposed to be sufficiently short when the first, second and third output pins out1, out2 and out3 of the functional block 11 are combined with the fourth, fifth and sixth external pins OUT1, OUT2 and OUT3, respectively.

Next, in the sub-step (2) of creating the partitioning information, the signal delay after the integrated circuit has been laid out is supposed to be estimated with each of the test data input and output circuits partitioned into two functional blocks. Suppose the signal delay on each signal path dedicated to the normal operation mode, not a signal path inserted for transmitting the test data, is sufficiently short if the first and second input pins in1 and in2 are classified as Group A, the third input pin in3 Group B, the first and second output pins out1 and out2 Group C and the third output pin out3 Group D in the functional block 11.

Then, in the sub-step (3) of deciding whether or not the buffers should be inserted, various combinations are made between the external pins IN1 through IN3 and the input pins in1 through in3 of the functional block 11 and between the external pins OUT1 through OUT3 and the output pins out1 through out3 of the functional block 11. The wire length after the integrated circuit has been laid out is estimated for each of these combinations. Suppose the decision result is that the signal shaping buffers should be inserted between the third external pin IN3 and the third input pin in3 of the functional block 11 and between the sixth external pin OUT3 and the third output pin out3 of the functional block 11.

Finally, in the sub-step (4) of deciding whether or not the flip-flops should be inserted, various combinations are made between the external pins IN1 through IN3 and the input pins in1 through in3 of the functional block 11 and between the external pins OUT1 through OUT3 and the output pins out1 through out3 of the functional block 11. The signal delay after the integrated circuit has been laid out is estimated for each of these combinations. Suppose the decision result is that the timing adjusting flip-flops should be inserted between the first external pin IN1 and the first input pin in1 of the functional block 11 and between the fourth external pin OUT1 and the first output pin out1 of the functional block 11.

In such a case, the pin combination information 33 is created as the following list structure (5) as a result of these sub-steps (1) through (4):

(T(IN1 in1 A 0 1)(IN2 in2 A 0 0)(IN3 in3 B 1 0)(OUT1 out1 C 0 1)(OUT2 out2 C 0 0)(OUT3 out3 D 1 0)  (5)

According to the fourth embodiment, the list structure (5) is supposed to have the same data items as those of the list structure (2) of the second embodiment for the sake of simplicity. Thus, the same semiconductor integrated circuit as the circuit 1B shown in FIG. 3 is formed in accordance with the testable integrated circuit information 23 created in Step 34 of outputting testable integrated circuit information.

As described above, according to the fourth embodiment, respective routes between the external pins of a semiconductor integrated circuit and the associated input and output pins of a functional block under test are defined, a test circuit is partitioned into a plurality of functional blocks and necessity of inserting signal shaping buffers or timing adjusting flip-flops is checked. In this manner, information about a testable semiconductor integrated circuit, to which test circuits have been inserted, can be obtained non-manually. Thus, the integrated circuit is adaptable to a large-scale semiconductor integrated circuit and testable in synchronism with a predetermined clock signal.

In the foregoing embodiment, when the routes between the external pins of the semiconductor integrated circuit and associated input and output pins of the functional block are defined, it is estimated how long the wires will be after the integrated circuit has been laid out and pin combination is made to shorten the maximum wire length of the test circuit. Alternatively, pin combination may also be made depending on an average wire length. Generally speaking, if the maximum wire length is shortened, then the operating speed increases. On the other hand, if the average wire length is shortened, then the area of an LSI chip can be reduced.

Also, in determining the combination of external pins of a semiconductor integrated circuit with input/output pins of a functional block, part of these pin combinations may be made by defining manually the pin allocation information as in the first through third embodiments, while the other combinations may be made by defining automatically the pin combination information as in this embodiment. That is to say, the pin combination information may be defined through both manual and automatic procedures.

Embodiment 5

Hereinafter, a fifth exemplary embodiment of the present invention will be described with reference to the accompanying drawings.

Figure 10:
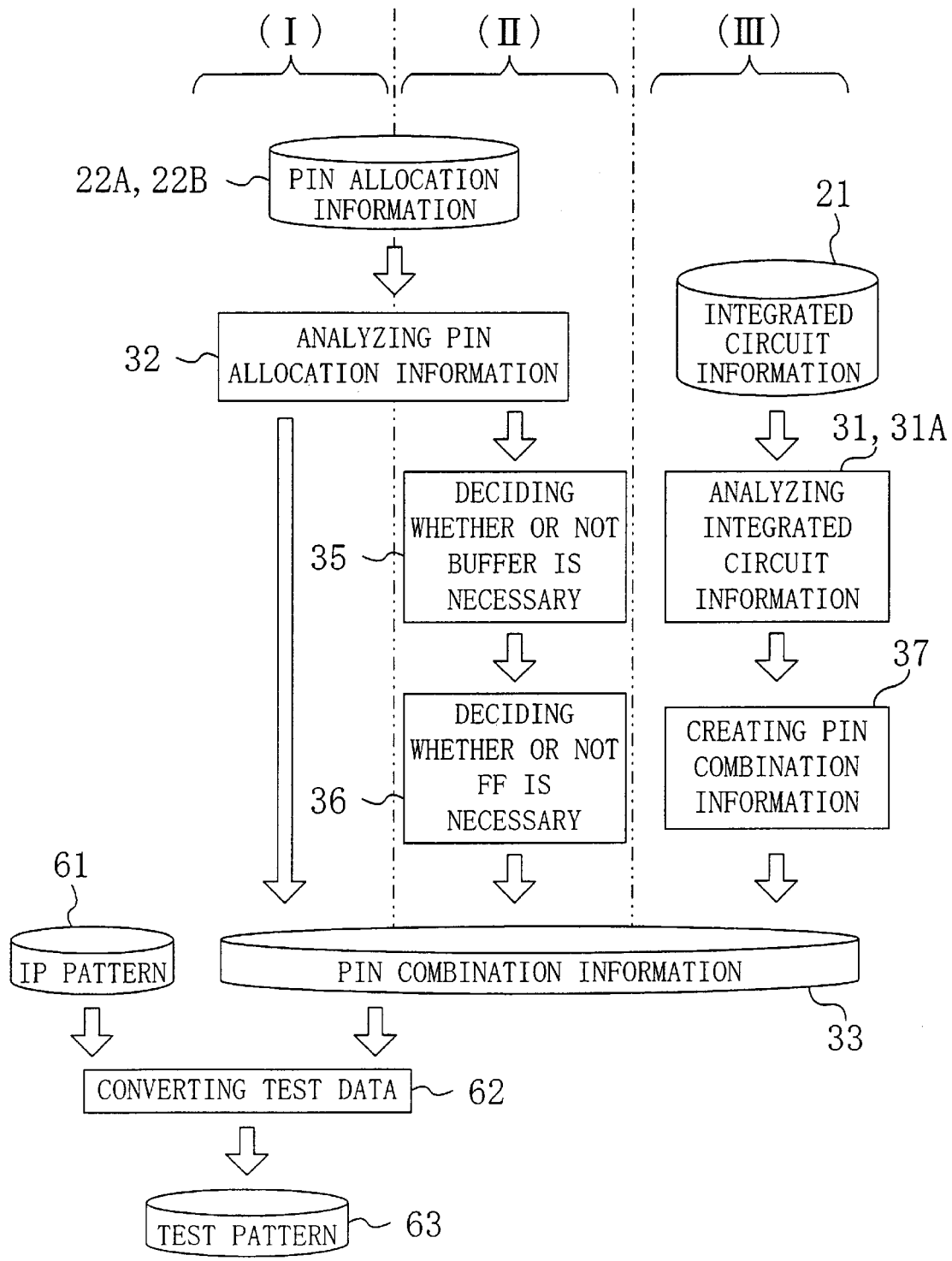
FIG. 10 is a flowchart illustrating a test data converting method according to a fifth embodiment of the present invention.

FIG. 10 illustrates a conceptual processing flow of a test data converting method according to the fifth embodiment. In this embodiment, block-by-block test data prepared for each functional block is converted into test data of the type making a semiconductor integrated circuit testable through external pins. According to this method, converted test data can be generated easily and just as intended by using the pin combination information 33 applicable to the test circuit inserting methods of the second through fourth embodiments.

Thus, the pin combination information 33 shown in FIG. 10 may be information (I) created in Step 32 of analyzing the pin allocation information 22A according to the second embodiment. Alternatively, the information 33 may be information (II) created by performing Steps 32, 35 and 36 of analyzing the pin allocation information 22B and deciding whether or not buffers and flip-flops should be inserted based on the pin allocation information 22B according to the third embodiment. Furthermore, the information 33 may be information (III) created in Step 37 of creating the pin combination information according to the fourth embodiment. Following is an exemplary list structure (6):

(T(IN1 in1 A 0 1)(IN2 in2 A 0 0)(IN3 in3 B 1 0)(OUT1 out1 C 0 1)(OUT2 out2 C 0 0)(OUT3 out3 D 1 0))     (6)

According to the fifth embodiment, the list structure (6) also has the same data items as those of the list structure (5) of the fourth embodiment for convenience sake.

The IP pattern 61 shown in FIG. 10 may be block-by-block test data for the functional block 11 included in the semiconductor integrated circuit 1A shown in FIG. 1, for example. The following Table 4 shows exemplary contents of the IP pattern 61:

TABLE 4

| Time | In1 | in2 | in3 | out1 | out2 | out3 |
|---|---|---|---|---|---|---|
| 1 | 1 | 0 | 1 | L | H | L |
| 2 | 0 | 1 | 0 | H | L | H |
| 3 | 1 | 0 | 1 | L | H | L |

In Table 4, the time refers to both a point in time the test data should be provided to the input pins of the functional block 11 and a point in time the expected values at respective output pins of the functional block 11 are compared to actual values. Thus, strictly speaking, the point in time comparison should be performed is later than the point in time the test data is input.

Also, the data in the individual columns for in1, in2 and in3 represent the values of the test data provided to these input pins of the functional block 11 at respective points in time. On the other hand, the data in the individual columns for out1, out2 and out3 represent the expected values of the test data output to these output pins of the functional block 11 at respective points in time. In Table 4, "H" means that the output data is "1", while "L" means that the output data is "0". By determining whether or not these expected values are equal to the actually output ones (i.e., by making expected value comparison), a fault can be detected from the functional block 11 if any.

In Step 62 of converting the test data as shown in FIG. 10, the pin combination information 33 and the IP pattern 61 are retrieved, thereby generating a test pattern 63 of the type making the semiconductor integrated circuit 1B shown in FIG. 3 testable.

First, the pin descriptions allocated as respective data items to each row of the IP pattern 61 are modified as defined by the pin combination information 33 i.e., based on the combination of respective pins of the functional block 11 with the external pins of the semiconductor integrated circuit 1A. Also, since the mode of operation is now test mode T, a signal indicating that is added. In the illustrated example, the value at the input pin T is set equal to "1".

As shown in FIGS. 6 and 7, the timing adjusting flip-flops 53 and 55 are inserted between the first external pin IN1 and the first input pin in1 of the functional block 11 and between the fourth external pin OUT1 and the first output pin out1 of the functional block 11, respectively. Thus, the test data at the input end is replaced with that at the previous time, while the test data at the output end is replaced with that at the next time.

The following Table 5 shows a test pattern 63 obtained by such a conversion for the testable semiconductor integrated circuit 1B:

TABLE 5

| Time | T | IN1 | IN2 | IN3 | OUT1 | OUT2 | OUT3 |
|---|---|---|---|---|---|---|---|
| 1 | 1 | 1 | X | X | * | * | * |
| 2 | 1 | 0 | 0 | 1 | * | H | L |
| 3 | 1 | 1 | 1 | 0 | L | L | H |
| 4 | 1 | X | 0 | 1 | H | H | L |
| 5 | 1 | X | X | X | L | * | * |

In the test pattern 63 shown in Table 5, the sign X indicates that an arbitrary value may be input and the sign * indicates that the expected value comparison is not performed.

As can be seen, according to the fifth embodiment, the IP pattern 61, which is block-by-block test data prepared for the functional block 11 under test, can be converted into the test pattern 63 for the testable semiconductor integrated circuit 1B quickly and just as intended based on the pin combination information 33 defined by the test circuit inserting method that can drastically reduce the manual workload.

What is claimed is:

1. A method for inserting a test circuit into an integrated circuit, which is made up of a plurality of functional blocks interconnected, such that test data can be externally input to at least one of the functional blocks when the functional block is tested, the method comprising the steps of:

a) obtaining pin allocation information including input and output pin connection information for the at least one functional block under test, the input pin connection information representing which input pin of the functional block should be connected to each external test data input pin, the output pin connection information representing which output pin of the functional block should be connected to each external test data output pin;

b) obtaining machine-readable pin combination information by analyzing the pin allocation information; and c) inserting a test data input circuit between the functional block under test and the external test data input pin or a test data output circuit between the functional block under test and the external test data output pin based on the pin combination information.

2. A method for inserting a test circuit into an integrated circuit, which is made up of a plurality of functional blocks interconnected, such that test data can be externally input to at least one of the functional blocks when the functional block is tested, the method comprising the steps of:

a) preparing pin allocation information including input and output pin connection information for the at least one functional block under test, the input pin connection information representing which input pin of the functional block should be connected to each external test data input pin, the output pin connection information representing which output pin of the functional block should be connected to each external test data output pin;

b) obtaining routing information by analyzing interconnection routes of the functional block based on information about the integrated circuit;

c) obtaining machine-readable pin combination information by analyzing the pin allocation information;

d) inserting a test data input circuit and an input signal direction controller between the external test data input pin and the functional block under test based on the pin combination information, the test data input circuit being used for inputting test data through the external test data input pin to the input pin of the functional block under test in a test mode, the input signal direction controller being provided for enabling the external test data input pin, which functions as an output or bidirectional pin in a normal operation mode, to input the test data in the test mode;

e) inserting a test data output circuit and an output signal direction controller between the functional block under test and the external test data output pin based on the pin combination information, the test data output circuit being used for outputting the test data to the external test data output pin through the output pin of the functional block under test in the test mode, the output signal direction controller being provided for enabling the external test data output pin, which functions as an input or bidirectional pin in the normal operation mode, to output the test data in the test mode; and f) updating the routing information based on how the test data input or output circuit inserted is connected and outputting the updated routing information as testable integrated circuit information.

3. The method of claim 2, wherein the step a) includes obtaining partitioning information for classifying the input or output pin connection information into a plurality of groups, and wherein the step d) includes inserting the test data input circuit into each said group based on the partitioning information, and wherein the step e) includes inserting the test data output circuit into each said group based on the partitioning information.

4. The method of claim 2, wherein the step a) includes obtaining signal shaping buffer information indicating whether or not a signal shaping buffer should be added to the test data input or output circuit to shape a waveform of a signal that has been rounded during the propagation thereof, and wherein the step d) includes inserting the signal shaping buffer into the test data input circuit based on the signal shaping buffer information, and wherein the step e) includes inserting the signal shaping buffer into the test data output circuit based on the signal shaping buffer information.

5. The method of claim 2, further comprising, between the steps c) and d) and between the steps c) and e), the sub-steps of:

estimating, based on the pin allocation information, how long a wire length of the test data input or output circuit inserted will be after the circuit has been laid out;

deciding whether or not a signal shaping buffer should be added to the test data input or output circuit to shape a waveform of a signal that has been rounded during the propagation thereof; and adding a result of the decision as signal shaping buffer information to the pin combination information, and wherein the step d) includes inserting the signal shaping buffer into the test data input circuit based on the signal shaping buffer information, and wherein the step e) includes inserting the signal shaping buffer into the test data output circuit based on the signal shaping buffer information.

6. The method of claim 2, wherein the step a) includes obtaining timing adjusting flip-flop information indicating whether or not a timing adjusting flip-flop should be added to the test data input or output circuit to prevent the integrated circuit from operating erroneously due to a considerable signal delay defined with respect to a clock period of the integrated circuit, and wherein the step d) includes inserting the timing adjusting flip-flop into the test data input circuit based on the timing adjusting flip-flop information, and wherein the step e) includes inserting the timing adjusting flip-flop into the test data output circuit based on the timing adjusting flip-flop information.

7. The method of claim 2, further comprising, between the steps c) and d) and between the steps c) and e), the sub-steps of:

estimating, based on the pin allocation information, how long a signal delay of the integrated circuit will be with respect to the clock period thereof after the integrated circuit has been laid out;

deciding whether or not a timing adjusting flip-flop should be added to the test data input or output circuit to prevent the integrated circuit from operating erroneously due to the signal delay; and adding a result of the decision as timing adjusting flip-flop information to the pin combination information, and wherein the step d) includes inserting the timing adjusting flip-flop into the test data input circuit based on the timing adjusting flip-flop information, and wherein the step e) includes inserting the timing adjusting flip-flop into the test data output circuit based on the timing adjusting flip-flop information.

8. A method for inserting a test circuit into an integrated circuit, which is made up of a plurality of functional blocks interconnected, such that test data can be externally input to at least one of the functional blocks when the functional block is tested, the method comprising the steps of:

a) obtaining routing information by analyzing interconnection routes of the functional block based on information about the integrated circuit;

b) obtaining pin combination information including input and output pin connection information for the at least one functional block under test, the input pin connection information representing which input pin of the functional block should be connected to each external test data input pin, the output pin connection information representing which output pin of the functional block should be connected to each external test data output pin;

c) inserting a test data input circuit and an input signal direction controller between the external test data input pin and the functional block under test based on the pin combination information, the test data input circuit being used for inputting test data through the external test data input pin to the input pin of the functional block under test in a test mode, the input signal direction controller being provided for enabling the external test data input pin, which functions as an output or bidirectional pin in a normal operation mode, to input the test data in the test mode;

d) inserting a test data output circuit and an output signal direction controller between the functional block under test and the external test data output pin based on the pin combination information, the test data output circuit being used for outputting the test data to the external test data output pin through the output pin of the functional block under test in the test mode, the output signal direction controller being provided for enabling the external test data output pin, which functions as an input or bidirectional pin in the normal operation mode, to output the test data in the test mode; and e) updating the routing information based on how the test data input or output circuit inserted is connected and outputting the updated routing information as testable integrated circuit information.

9. The method of claim 8, wherein the step b) includes estimating how long a signal delay of the integrated circuit will be with respect to a clock period thereof after the integrated circuit has been laid out and obtaining partitioning information for classifying each of the input and output pin connection information into a plurality of groups so as to reduce the signal delay in the normal mode, and wherein the step c) includes inserting the test data input circuit into each said group based on the partitioning information, and wherein the step d) includes inserting the test data output circuit into each said group based on the partitioning information.

10. The method of claim 8, wherein the step b) includes estimating how long a wire between adjacent ones of the functional blocks will be after the integrated circuit has been laid out and then obtaining the pin combination information so as to shorten a maximum or average wire length of the test data input and output circuits in the integrated circuit.

11. The method of claim 8, wherein the step b) includes the sub-steps of:

estimating, based on the pin combination information, how long a wire length of the test data input or output circuit inserted will be after the integrated circuit has been laid out;

deciding whether or not a signal shaping buffer should be added to the test data input or output circuit to shape a waveform of a signal that has been rounded during the propagation thereof; and defining a result of the decision as signal shaping buffer information, and wherein the step c) includes inserting the signal shaping buffer into the test data input circuit based on the signal shaping buffer information, and wherein the step d) includes inserting the signal shaping buffer into the test data output circuit based on the signal shaping buffer information.

12. The method of claim 8, wherein the step b) includes the sub-steps of:

estimating, based on the pin combination information, how long a signal delay of the integrated circuit will be with respect to the clock period thereof after the integrated circuit has been laid out;

deciding whether or not a timing adjusting flip-flop should be added to the test data input or output circuit to prevent the integrated circuit from operating erroneously due to the signal delay; and defining a result of the decision as timing adjusting flip-flop information, and wherein the step c) includes inserting the timing adjusting flip-flop into the test data input circuit based on the timing adjusting flip-flop information, and wherein the step d) includes inserting the timing adjusting flip-flop into the test data output circuit based on the timing adjusting flip-flop information.

13. A method for converting block-by-block test data prepared for each of a plurality of functional blocks, which are interconnected together to form an integrated circuit, into test data of the type making the functional blocks in the integrated circuit externally testable, the method comprising the steps of:

a) preparing pin allocation information including input and output pin connection information for at least one of the functional blocks under test, the input pin connection information representing which input pin of the functional block should be connected to each external test data input pin, the output pin connection information representing which output pin of the functional block should be connected to each external test data output pin;

b) obtaining machine-readable pin combination information by analyzing the pin allocation information; and c) converting the block-by-block test data into the test data for the integrated circuit based on the pin combination information.

14. A method for converting block-by-block test data prepared for each of a plurality of functional blocks, which are interconnected together to form an integrated circuit, into test data of the type making the functional blocks in the integrated circuit externally testable, the method comprising the steps of:

a) obtaining routing information by analyzing interconnection routes of the functional block based on information about the integrated circuit;

b) obtaining pin combination information including input and output pin connection information for at least one of the functional blocks under test, the input pin connection information representing which input pin of the functional block should be connected to each external test data input pin, the output pin connection information representing which output pin of the functional block should be connected to each external test data output pin; and d) converting the block-by-block test data into the test data for the integrated circuit based on the pin combination information.

* * * * *